(12) United States Patent
Kawasaki et al.

(10) Patent No.: US 10,126,414 B2
(45) Date of Patent: Nov. 13, 2018

(54) PROXIMITY SENSOR

(71) Applicants: Yuya Kawasaki, Tokyo (JP); Naosumi Waki, Tokyo (JP)

(72) Inventors: Yuya Kawasaki, Tokyo (JP); Naosumi Waki, Tokyo (JP)

(73) Assignee: MITSUMI ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 15/696,530

(22) Filed: Sep. 6, 2017

(65) Prior Publication Data
US 2018/0088217 A1     Mar. 29, 2018

(30) Foreign Application Priority Data

Sep. 29, 2016 (JP) .................................. 2016-192281

(51) Int. Cl.
| | |
|---|---|
| G01S 7/48 | (2006.01) |
| G01S 7/486 | (2006.01) |
| G01S 17/08 | (2006.01) |
| H01L 31/02 | (2006.01) |
| H01L 31/173 | (2006.01) |
| H03K 17/955 | (2006.01) |
| G01S 17/02 | (2006.01) |
| H03K 17/94 | (2006.01) |

(52) U.S. Cl.
CPC .......... *G01S 7/4861* (2013.01); *G01S 17/026* (2013.01); *G01S 17/08* (2013.01); *H01L 31/02019* (2013.01); *H01L 31/173* (2013.01); *H03K 17/941* (2013.01); *H03K 17/955* (2013.01); *H03K 2217/94116* (2013.01)

(58) Field of Classification Search
CPC ... G01S 7/4861; G01S 17/08; H01L 31/02019
See application file for complete search history.

(56) References Cited

U.S. PATENT DOCUMENTS

2016/0133668 A1* 5/2016 Rothberg ........... G01N 21/6408
250/206

FOREIGN PATENT DOCUMENTS

JP    H06-152364    5/1994

* cited by examiner

*Primary Examiner* — Hugh H Maupin
(74) *Attorney, Agent, or Firm* — IPUSA, PLLC

(57) ABSTRACT

A proximity sensor for detecting proximity of an object, by sensing reflected light coming from an object on which a light emission pulse is reflected, the proximity sensor includes: a converter circuit configured to convert a current output from a photodetector sensing the reflected light into a voltage, and to output the voltage, magnitude of the current depending on a degree of the proximity of the object; a differential converter circuit configured to convert the voltage output by the converter circuit into a differential voltage, and to output the differential voltage; and a correlated double sampling circuit having a differential configuration, and configured to subtract a value of the differential voltage output by the differential converter circuit, sampled at falling of the light emission pulse, from a value of the differential voltage sampled at rising of the light emission pulse.

9 Claims, 5 Drawing Sheets

PROXIMITY SENSOR

CROSS-REFERENCE TO RELATED APPLICATIONS

This patent application is based upon and claims the benefit of Japanese Priority Application No. 2016-192281, filed on Sep. 29, 2016, with the Japanese Patent Office, the entire contents of which are hereby incorporated by reference.

BACKGROUND OF THE INVENTION

1. Field of the Invention

The present disclosure relates to a proximity sensor.

2. Description of the Related Art

Conventionally, a technology has been known that detects existence of an object, by sensing reflected light of a light emission pulse reflected on the object (see, for example, Patent document 1).

RELATED-ART DOCUMENTS

Patent Documents

[Patent Document 1] Japanese Unexamined Patent Application Publication No. 6-152364

However, if there is an influence of disturbance light (for example, ambient light such as the sunlight and illumination light) included in the reflected light, detection precision of a degree of proximity of the object may decrease.

Thereupon, an embodiment in the present disclosure has an object to provide a proximity sensor that increases detection precision of a degree of proximity of an object.

SUMMARY OF THE INVENTION

In order to achieve the object, according to an aspect of this disclosure, a proximity sensor for detecting proximity of an object, by sensing reflected light coming from an object on which a light emission pulse is reflected, the proximity sensor includes: a converter circuit configured to convert a current output from a photodetector sensing the reflected light into a voltage, and to output the voltage, magnitude of the current depending on a degree of the proximity of the object; a differential converter circuit configured to convert the voltage output by the converter circuit into a differential voltage, and to output the differential voltage; and a correlated double sampling circuit having a differential configuration, and configured to subtract a value of the differential voltage output by the differential converter circuit, sampled at falling of the light emission pulse, from a value of the differential voltage sampled at rising of the light emission pulse.

According to such an aspect of the present disclosure, it is possible to raise detection precision of a degree of proximity of an object.

DETAILED DESCRIPTION OF THE PREFERRED EMBODIMENTS

In the following, embodiments in the present disclosure will be described with reference to the drawings.

Figure 1:
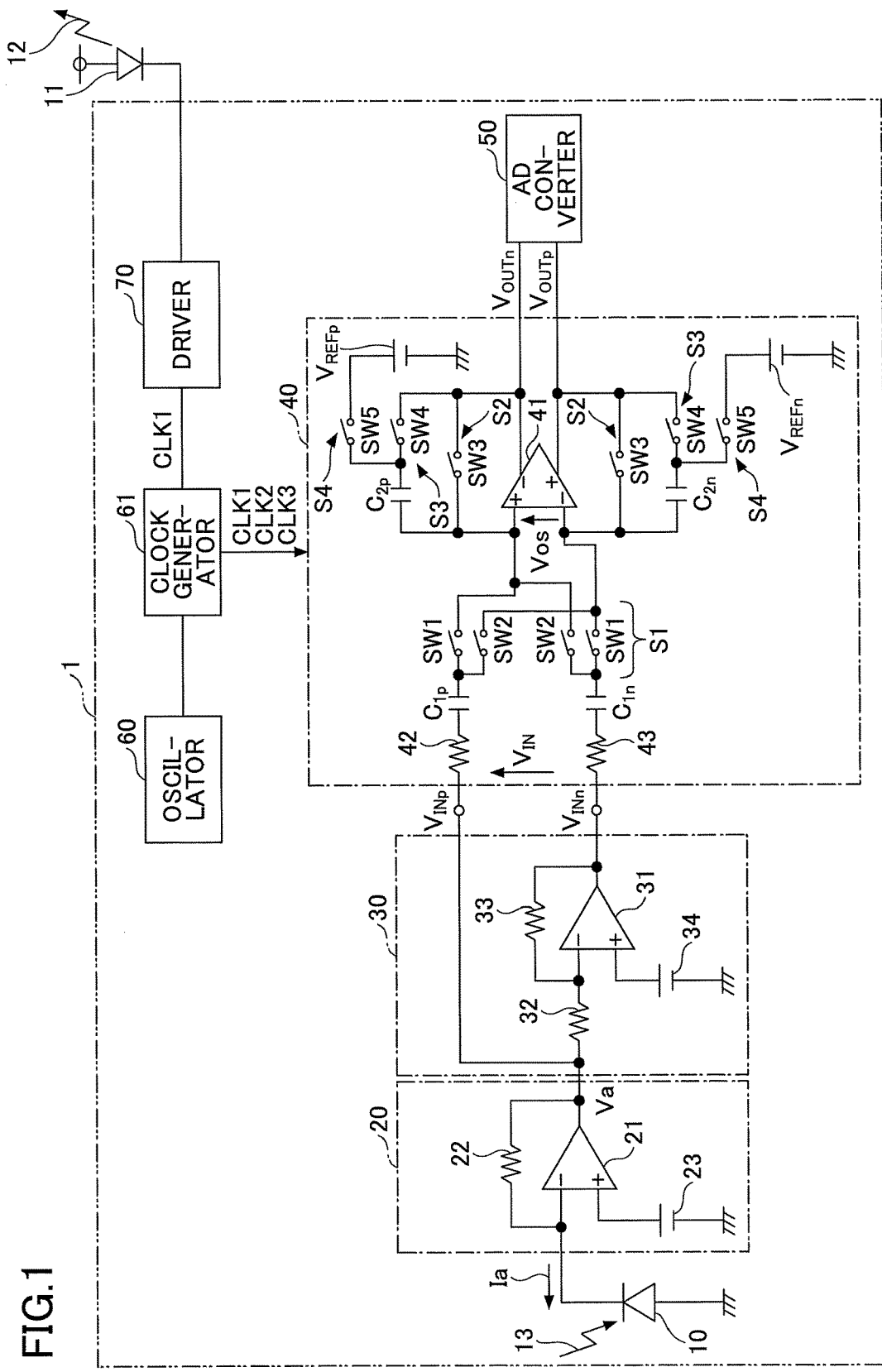
FIG. 1 is a diagram illustrating an example of a configuration of a proximity sensor.

FIG. 1 is a diagram illustrating an example of a configuration of a proximity sensor. The proximity sensor 1 drives a light emitter 11 so that a light emission pulse 12 is emitted from the light emitter 11, and causes a photodetector 10 to sense reflected light 13 coming from an object on which the light emission pulse 12 emitted from the light emitter 11 is reflected. Then, the proximity sensor 1 detects proximity of the object, based on the intensity of the reflected light 13 sensed by the photodetector 10.

Objects detected by the proximity sensor 1 in the proximity include the entirety and portions (for example, hand, finger, and face) of a human body. The proximity sensor 1 is installed in a portable information device, for example, a smart phone.

The proximity sensor 1 is, for example, a semiconductor integrated circuit formed on a chip. The proximity sensor 1 may be a bare chip not packaged, or may be a module product in a resin package. Alternatively, the proximity sensor 1 may be a part corresponding to a proximity sensor in a semiconductor integrated circuit in which an illuminance sensor and the proximity sensor are integrated.

The proximity sensor 1 includes an oscillator 60, the clock generator 61, a driver 70, the photodetector 10, a converter circuit 20, a differential converter circuit 30, a correlated double sampling circuit 40, and an A/D (Analog-to-Digital) converter 50.

The oscillator 60 is a circuit that outputs an oscillation signal. The clock generator 61 is a circuit that generates a first clock CLK1 and a second clock CLK2 based on the oscillation signal output from the oscillator 60. The frequency of the second clock CLK2 is twice the frequency of the first clock CLK1.

The driver 70 is a drive circuit that drives the light-emitting element 11 at the frequency of the first clock CLK1, to cause the light-emitting element 11 to emit light emission pulses 12 at the same frequency as the first clock CLK1.

As a specific example of the light emitter 11, a light-emitting diode may be cited. The light emitter 11 outputs, for example, a light emission pulse 12 of infrared light. Although FIG. 1 illustrates a form in which the light emitter 11 is externally connected to the proximity sensor 1, the light emitter 11 may be built in the proximity sensor 1. FIG. 1 also illustrates a form in which the cathode of the light-emitting diode is connected to the driver 70, and the driver 70 takes in the current for driving from the light-emitting diode. However, it is possible to consider a form in which the anode of the light-emitting diode is connected to the driver 70, and the driver 70 supplies the current for driving the light-emitting diode.

The photodetector 10 is an example of a photodetector that senses the reflected light 13, and senses a degree of proximity of an object, by using the photoelectric effect. The photodetector 10 is an example of an optical sensor that outputs a current Ia whose magnitude depends on the degree of proximity between the photodetector 10 and an object, so as to output a higher current Ia when the object approaches the photodetector 10 closer, for example. As a specific example of the photodetector 10, a photodiode may be cited.

The converter circuit 20 is an example of a current-to-voltage converter circuit that converts the current Ia into a voltage Va and outputs Va. The converter circuit 20 is a TIA (transimpedance amplifier) of a single-ended output type, for example. The converter circuit 20 is a circuit that converts a current Ia output from the photodetector 10 into a voltage Va by a transimpedance 22, outputs Va, and includes an operational amplifier 21 having a negative feedback loop through the transimpedance 22. The operational amplifier 21 has a non-inverted-input node into which a reference voltage 23 is input, and an inverted-input node to which the current output part of the photodetector 10 (in the case of FIG. 1, the cathode of the photodiode) is connected. The anode of the photodiode is connected to the ground.

The differential converter circuit 30 converts the voltage Va (output voltage Va) output from the converter circuit 20 into the differential voltage $V_{IN}$, and outputs $V_{IN}$. The differential converter circuit 30 is an inverting amplification circuit that includes, for example, an input resistor 32, a feedback resistor 33, and an operational amplifier 31. One end of the input resistor 32 is connected to the output node of the operational amplifier 21 (the output node of the voltage Va), and the other end of the input resistor 32 is connected to the inverted-input node of the operational amplifier 31. The output node of the operational amplifier 31 is connected to the inverted-input node of the operational amplifier 31 via the feedback resistor 33. The reference voltage 34 is input into the non-inverted-input node of the operational amplifier 31.

The differential voltage $V_{IN}$ output from the differential converter circuit 30 (the output differential voltage $V_{IN}$) is a voltage obtained by subtracting a voltage $V_{INn}$ from a voltage $V_{INp}$. The voltage $V_{INp}$ is equivalent to the voltage Va, and the voltage $V_{INn}$ is the voltage of the output node of the operational amplifier 31.

The correlated double sampling circuit 40 subtracts a value of the output differential voltage $V_{IN}$ sampled at falling of a light emission pulse 12, from a value of the output differential voltage $V_{IN}$ sampled at rising of the light emission pulse 12. The correlated double sampling circuit 40 is a switched-capacitor circuit having a differential input-differential output configuration. In the following, a value of the output differential voltage $V_{IN}$ sampled at rising of the light emission pulse 12 will be referred to as a "sampled rising value $V_{OUTp}$" and a value of the output differential voltage $V_{IN}$ sampled at falling of the light emission pulse 12 will be referred to as a "sampled falling value $V_{OUTn}$".

The correlated double sampling circuit 40 outputs a value subtracting a sampled falling value $V_{OUTn}$ from a sampled rising value $V_{OUTp}$, as the output voltage $V_{OUT}$ ($V_{OUT}=V_{OUTp}-V_{OUTn}$).

The A/D converter 50 is a circuit that converts an analog output voltage $V_{OUT}$ into digital data. The A/D converter 50 may be provided on the outside of the proximity sensor 1.

The output voltage $V_{OUT}$ (or the digital data output from the A/D converter 50) has magnitude that depends on the intensity of the reflected light 13. Therefore, the proximity sensor 1 can detect the degree of proximity of an object by obtaining the output voltage $V_{OUT}$ (or the digital data output from the A/D converter 50).

Further, provided with the correlated double sampling circuit 40 having a differential configuration, the proximity sensor 1 is less likely to be influenced by disturbance light included in the reflected light 13. As a result, it is possible to improve detection precision of the degree of proximity of an object.

Next, an example of a more detailed configuration of the correlated double sampling circuit 40 will be described.

The correlated double sampling circuit 40 includes a differential amplifier 41, a pair of resistors 42 and 43, a first pair of capacitors $C_{1p}$ and $C_{1n}$, a second pair of capacitors $C_{2p}$ and $C_{2n}$, a first switch circuit S1, a second switch circuit S2, a third switch circuit S3, and a fourth switch circuit S4.

The differential amplifier 41 has a configuration of difference input-differential output. The differential amplifier 41 has a pair of input nodes (a non-inverted-input node and an inverted-input node), and a pair of output nodes (a non-inverted output node and an inverted output node).

The resistor 42 is an element inserted in series between the output point of the voltage $V_{INp}$, and the capacitor $C_{1p}$. The resistor 43 is an element inserted in series between the output point of the voltage $V_{INn}$, and the capacitor $C_{1n}$.

The second pair of capacitors $C_{2p}$ and $C_{2n}$ are elements inserted in series between the pair of input nodes of the differential amplifier 41, and the pair of output nodes of the differential amplifier 41. The capacitor $C_{2p}$ is an element inserted in series on a first path that connects the non-inverted-input node of the differential amplifier 41, and the inverted output node of the differential amplifier 41. The capacitor $C_{2n}$ is an element inserted in series on a second path that connects the inverted-input node of the differential amplifier 41, and the non-inverted output node of the differential amplifier 41.

The first switch circuit S1 reverses the connection relationship between the pair of capacitors $C_{1p}$ and $C_{1n}$ and the pair of input nodes of the differential amplifier 41, at rising and falling of the light emission pulse 12. The first switch circuit S1 reverses the connection relationship between the pair of capacitors $C_{1p}$ and $C_{1n}$ and the pair of input nodes of the differential amplifier 41, for example, following the first clock CLK1 having the same cycle as the light emission pulse 12.

The first switch circuit S1 has, for example, a pair of switches SW1 and a pair of switches SW2. One of the switches SW1 is an element inserted in series between the capacitor $C_{1p}$ and the non-inverted-input node of the differential amplifier 41. The other one of the switches SW1 is an element inserted in series between the capacitor $C_{1n}$ and the inverted-input node of the differential amplifier 41. One of the switches SW2 is an element inserted in series between the capacitor $C_{1p}$ and the inverted-input node of the differential amplifier 41. The other one of the switches SW2 is an element inserted in series between the capacitor $C_{1n}$ and the non-inverted-input node of the differential amplifier 41.

The second switch circuit S2 turns off the connection between the pair of input nodes of the differential amplifier 41, and the pair of output nodes of the differential amplifier 41, at rising and falling of the light emission pulse 12. The second switch circuit S2 turns off the connection between the pair of input nodes of the differential amplifier 41, and the pair of output nodes of the differential amplifier 41, for example, following the second clock CLK having the cycle half of the light emission pulse 12.

The second switch circuit S2 has, for example, a pair of switches SW3. One of the switches SW3 is an element inserted in series on a third path that connects the non-inverted-input node of the differential amplifier 41, and the inverted output nodes of the differential amplifier 41. The other one of the switches SW3 is an element inserted in series on a fourth path that connects the inverted-input node of the differential amplifier 41, and the non-inverted output nodes of the differential amplifier 41.

The third switch circuit S3 turns off the connection between the second pair of capacitors $C_{2p}$ and $C_{2n}$ and the pair of output nodes of the differential amplifier 41, when the second switch circuit S2 turns on the connection between the pair of input nodes of the differential amplifier 41, and the pair of output nodes of the differential amplifier 41. On the other hand, the third switch circuit S3 turns on the connection between the second pair of capacitors $C_{2p}$ and $C_{2n}$ and the pair of output nodes of the differential amplifier 41, when the second switch circuit S2 turns off the connection between the pair of input nodes of the differential amplifier 41, and the pair of output nodes of the differential amplifier 41. The third switch circuit S3 reverses on and off of the connection between the second pair of capacitors $C_{2p}$ and $C_{2n}$ and the pair of output nodes of the differential amplifier 41, for example, following a third clock CLK3 whose phase is opposite to the phase of the second clock CLK2.

The third switch circuit S3 has, for example, a pair of switches SW4. One of the switches SW4 is an element inserted in series on a path that connects between the capacitor $C_{2p}$ and the inverted output nodes of the differential amplifier 41. The other one of the switches SW4 is an element inserted in series on a path that connects between the capacitor $C_{2n}$ and the non-inverted output nodes of the differential amplifier 41.

The fourth switch circuit S4 initializes the second pair of capacitors $C_{2p}$ and $C_{2n}$ by using a predetermined reference voltage. The fourth switch circuit S4 has, for example, a pair of switches SW5. One of the switches SW5 is an element provided for applying a reference voltage $V_{REFp}$ to a part between the capacitor $C_{2p}$ and the one of the switches SW4. The other one of the switches SW5 is an element provided for applying a reference voltage $V_{REFn}$ to a part between the capacitor $C_{2n}$ and the other one of the switches SW4.

Figure 2:
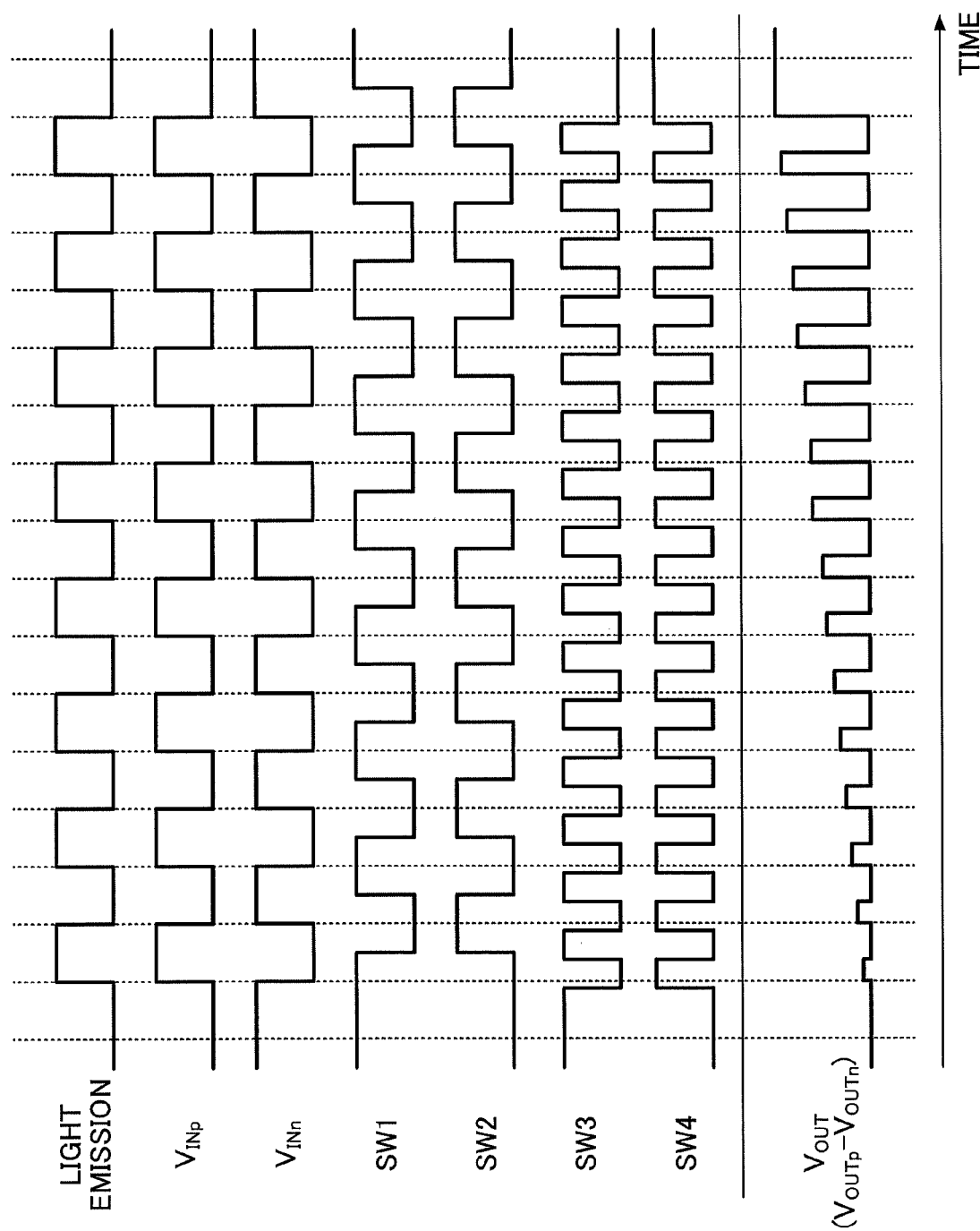
FIG. 2 is a timing chart illustrating an example of operations of the proximity sensor.

FIG. 2 is a timing chart illustrating an example of operations of the proximity sensor 1. In FIG. 2, "light emission" represents the light emission cycle of the light emission pulse 12; a high-level interval represents a state where light is emitted, and a low-level interval represents a state where light is not emitted. Also, in either of SW1-SW4, a high-level interval represents a period during which the switch is turned on, and a low-level interval represents a period during which the switch is turned off. By having the switches turned on and off as such, the output voltage \Jour is generated as illustrated in the figure.

Figure 3:
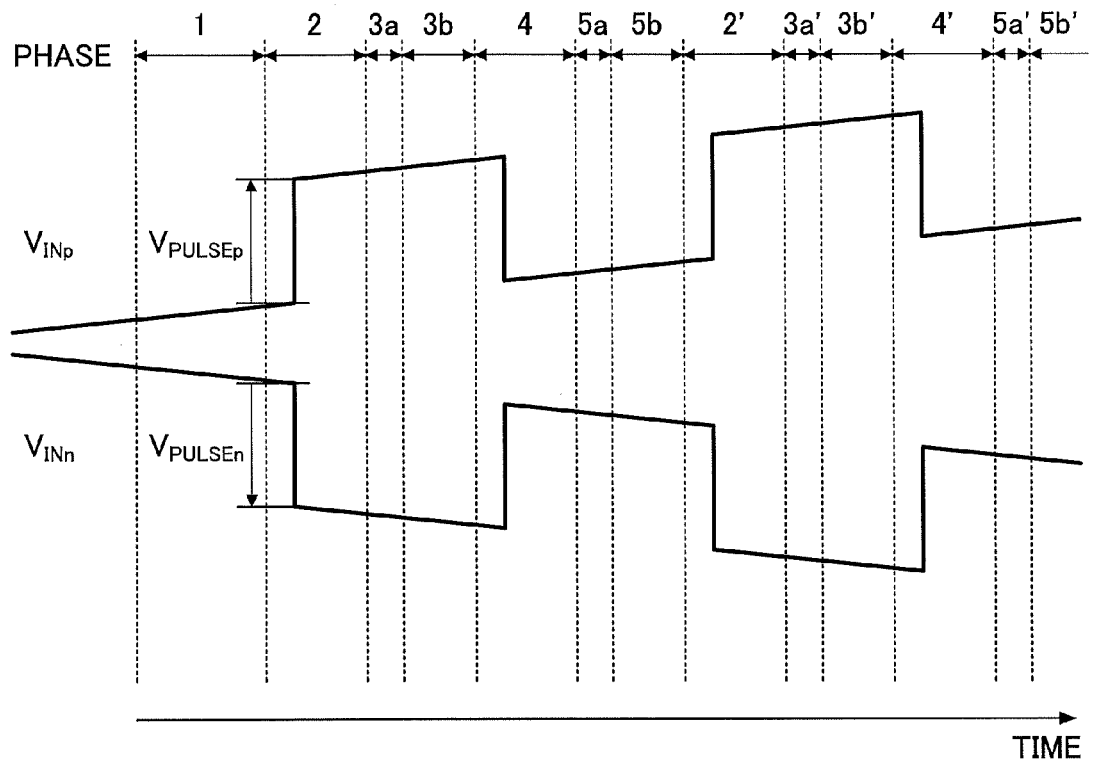
FIG. 3 is a timing chart illustrating an example of a relationship between a differential voltage input into a correlated double sampling circuit, and sampling phases of the correlated double sampling circuit.

FIG. 3 is a timing chart illustrating an example of a relationship between differential voltage (voltage $V_{INp}$ and voltage $V_{INn}$) input into the correlated double sampling circuit 40, and sampling phases of the correlated double sampling circuit 40. FIG. 3 illustrates the differential voltage (voltage $V_{INp}$ and voltage $V_{INn}$) input into the correlated double sampling circuit 40 in the case where the low frequency noise of disturbance light is included in the reflected light 13.

In the following, operations of the correlated double sampling circuit 40 at respective sampling phases will be described with reference to FIG. 3. The following equations are assumed hereafter.

$$V_{IN} = V_{INp} - V_{INn}$$

$$V_{OS} = V_{OSp} - V_{OSn}$$

$$V_{REF} = V_{REFp} - V_{REFn}$$

$$V_{PULSE} = V_{PULSEp} - V_{PULSEn}$$

$$V_{NOISE} = V_{NOISEp} - V_{NOISEn}$$

$$V_{OUT} = V_{OUTp} - V_{OUTn}$$

$$C1p = C1n$$

$$C2p = C2n$$

Here, $V_{OS}$ represents an offset voltage of the differential amplifier 41. $V_{PULSEp}$ represents a voltage change at a rising or falling edge of the voltage $V_{INp}$. $V_{PULSEn}$ represents a voltage change at a falling or rising edge of the voltage $V_{INn}$. $V_{NOISE}$ represents a low-frequency noise of disturbance light. Assume that the capacitance $C_{1p}$ of the capacitor $C_{1p}$ is equivalent to the capacitance $C_{1n}$ of capacitor $C_{1n}$. Assume that the capacitance $C_{2p}$ of the capacitor $C_{2p}$ is equivalent to the capacitance $C_{2n}$ of capacitor $C_{2n}$.

Figure 4:
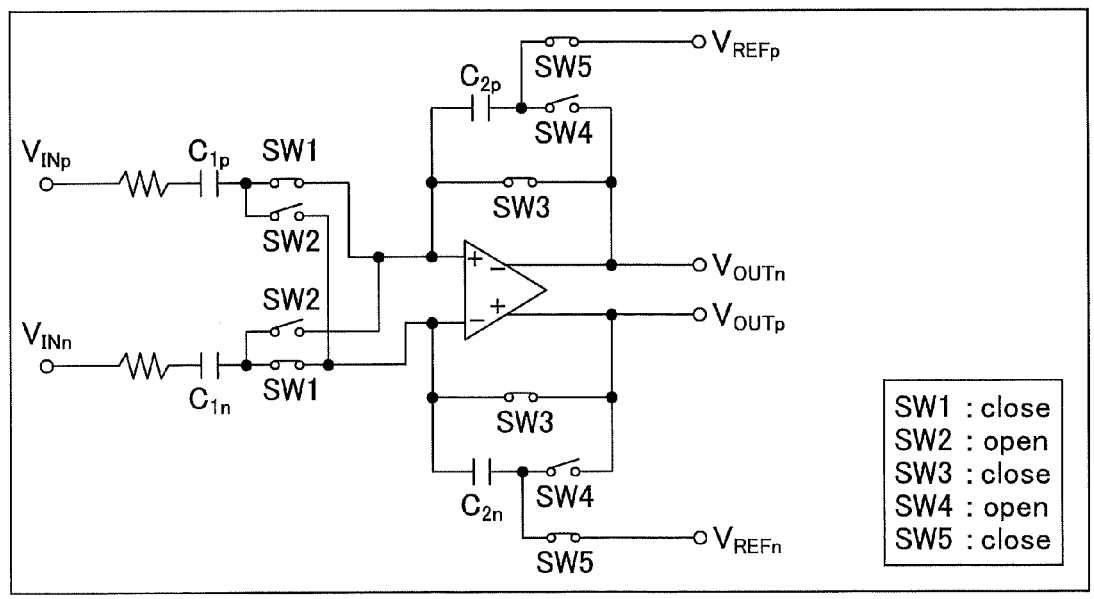
FIG. 4 is a diagram illustrating open/close states of switches in Phase 1.
Figure 5:
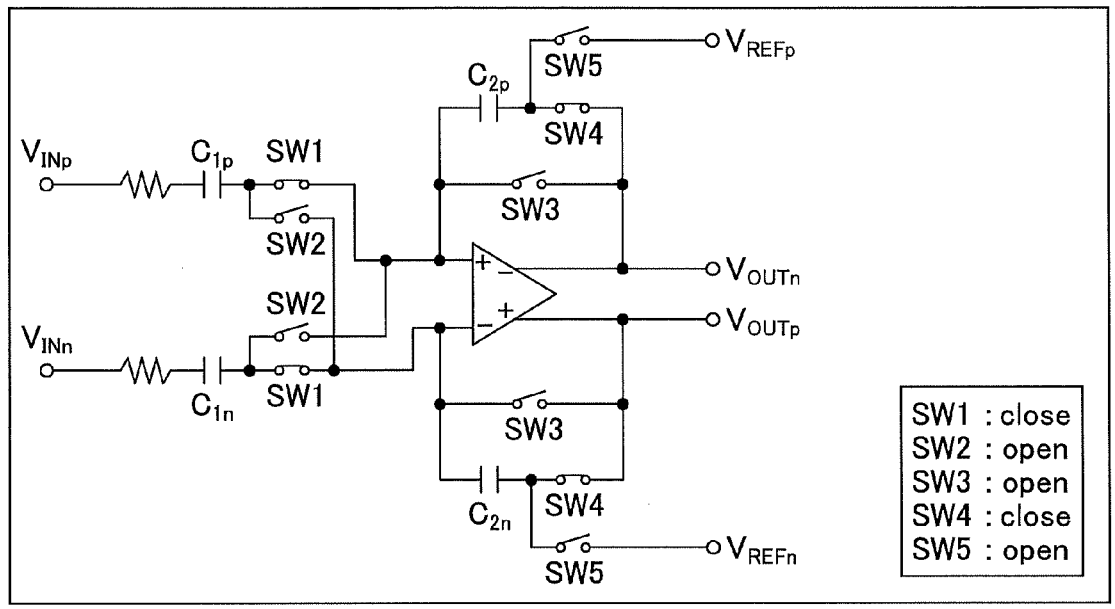
FIG. 5 is a diagram illustrating open/close states of switches in Phase 2.
Figure 6:
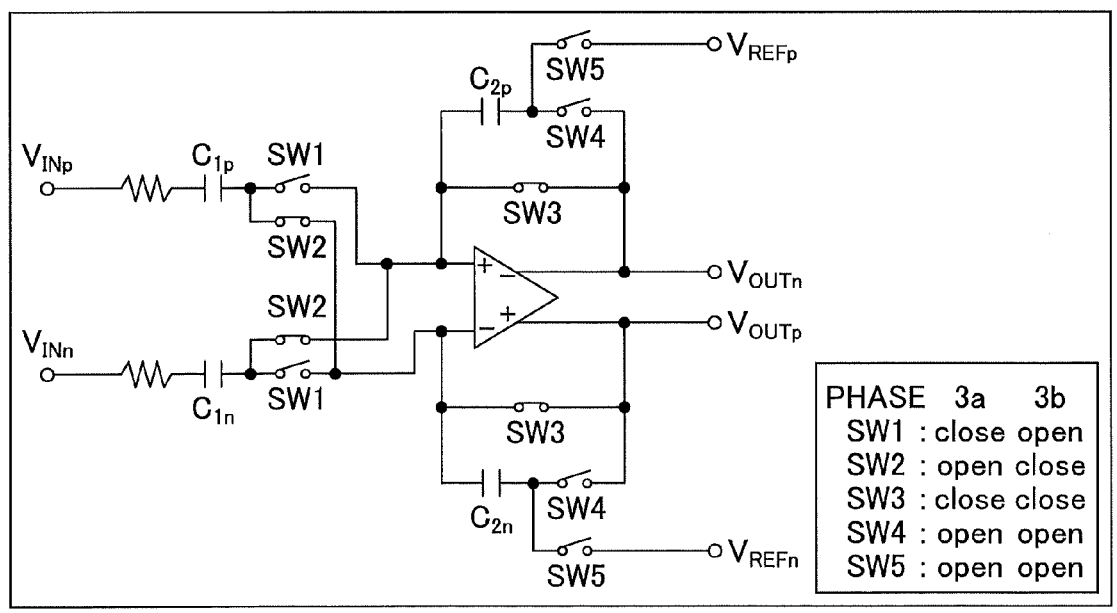
FIG. 6 is a diagram illustrating open/close states of switches in Phase 3.
Figure 7:
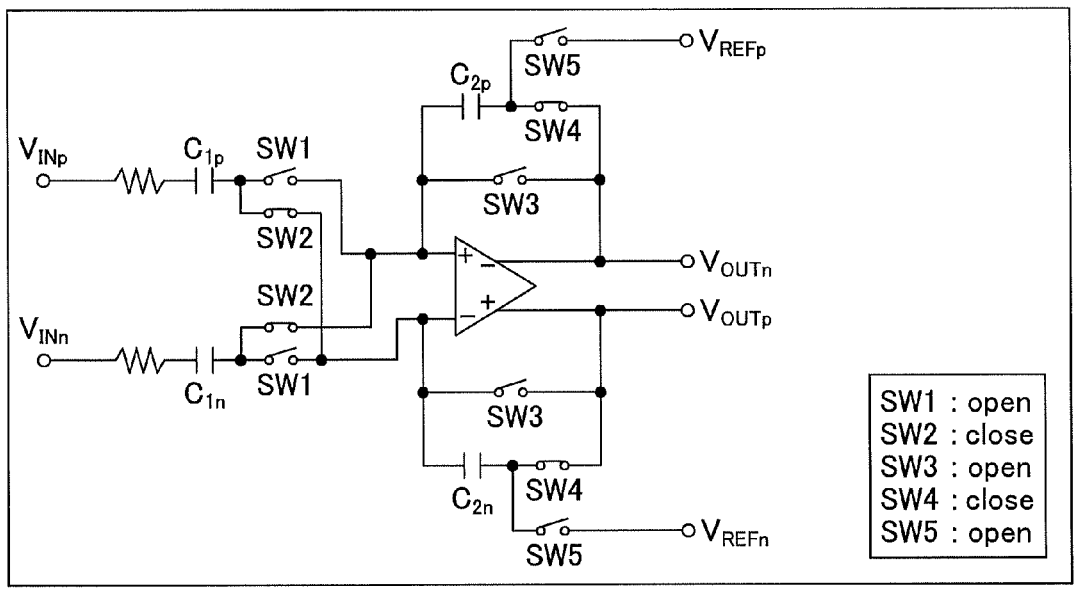
FIG. 7 is a diagram illustrating open/close states of switches in Phase 4.
Figure 8:
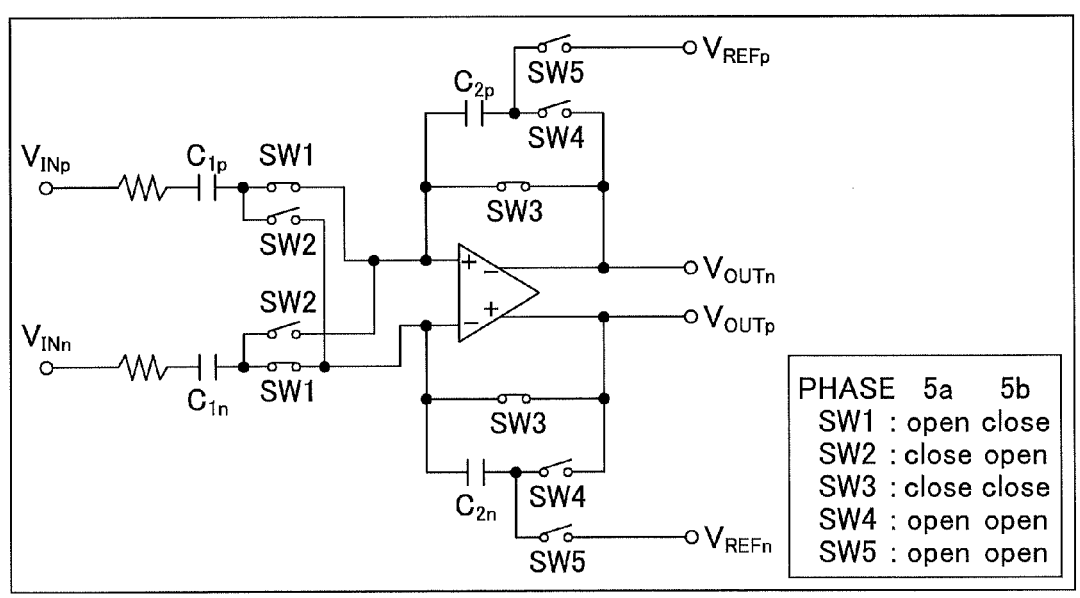
FIG. 8 is a diagram illustrating open/close states of switches in Phase 5.

FIG. 4 is a diagram illustrating open/close states of the switches in Phase 1. FIG. 5 is a diagram illustrating open/close states of the switches in Phase 2. FIG. 6 is a diagram illustrating open/close states of the switches in Phase 3. FIG. 7 is a diagram illustrating open/close states of the switches in Phase 4. FIG. 8 is a diagram illustrating open/close states of the switches in Phase 5. In FIGS. 4-8, "close" represents that the switch is in a closed state (on state), and "open" represents that the switch is an open state (off state).

<Phase 1 (Initialization)>

FIG. 4 is a diagram illustrating open/close states of the switches in Phase 1. Phase 1 represents a sampling phase during which the pair of capacitors $C_{1p}$ and $C_{1n}$ preserve the output offset voltage of the operational amplifiers 21 and 31 (see FIG. 1) at the preceding stages, and the input offset voltage of the differential amplifier 41 at the following stage, in a state of no signal, which indicates that no object is approaching.

The electric charges $Q^1$ of the capacitors $C_{1p}$, $C_{1n}$, $C_{2p}$, and $C_{2n}$ in Phase 1 are represented by the following formulas, respectively.

$$Q^1_{C1p} = -(V^1_{INp} - V_{OSp}) \cdot C1p$$

$$Q^1_{C1n} = (V_{OSn} - V^1_{INn}) \cdot C1n$$

$$Q^1_{C2p} = (V_{REFp} - V_{OSp}) \cdot C2p$$

$$Q^1_{C2n} = (V_{OSn} - V_{REFn}) \cdot C2n$$

Note that an upper right subscript of Q or V represents one of the phases, and a lower right symbol of Q represents one of the capacitors. These are the same in the following description.

Therefore, in Phase 1, the electric charge $Q^1_{C1}$ accumulated in the pair of capacitors $C_{1p}$ and $C_{1n}$, and the electric charge $Q^1_{C2}$ accumulated in the pair of capacitors $C_{2p}$ and $C_{2n}$ are represented by the following formulas, respectively.

$$Q_{C1}^1 = Q_{C1p}^1 + Q_{C1n}^1 \quad (1)$$
$$= (V_{INp}^1 - V_{OSp}) \cdot C1p + (V_{OSn} - V_{INn}^1) \cdot C1n$$
$$= (V_{IN}^1 - V_{OS}) \cdot C1$$

$$Q_{C2}^1 = Q_{C2p}^1 + Q_{C2n}^1 \quad (2)$$
$$= (V_{REFp} - V_{OSp}) \cdot C2p + (V_{OSn} - V_{REFn}) \cdot C2n$$
$$= (V_{REF} - V_{OS}) \cdot C2$$

<Phase 2 (First Sampling Period)>

FIG. 5 is a diagram illustrating open/close states of the switches in Phase 2. Phase 2 represents a sampling phase when the light emission pulse 12 rises.

The electric charges $Q^2$ of the capacitors $C_{1p}$, $C_{1n}$, $C_{2p}$, and $C_{2n}$ in Phase 2 are represented by the following formulas, respectively.

$$Q^2_{C1p} = (V^1_{INp} + V_{PULSEp} + V^2_{NOISEp} - V_{OSp}) \cdot C1p$$

$$Q^2_{C1n} = (V_{OSn} - V^1_{INn} - V_{PULSEn} - V^2_{NOISEn}) \cdot C1n$$

$$Q^2_{C2p} = (V^2_{OUTn} - V_{OSp}) \cdot C2p$$

$$Q^2_{C2n} = (V_{OSn} - V^2_{OUTp}) \cdot C2n$$

Therefore, in Phase 2, the electric charge $Q^2_{C1}$ accumulated in the pair of capacitors $C_{1p}$ and $C_{1n}$, and the electric charge $Q^2_{C2}$ accumulated in the pair of capacitors $C_{2p}$ and $C_{2n}$ are represented by the following formulas, respectively.

$$Q_{C1}^2 = Q_{C1p}^2 + Q_{C1n}^2 \quad (3)$$
$$= (V_{INp}^1 + V_{PULSEp} + V_{NOISEp}^2 - V_{OSp}) \cdot C1p +$$
$$(V_{OSn} - V_{INn}^1 - V_{PULSEn} - V_{NOISEn}^2) \cdot C1n$$
$$= (V_{IN}^1 + V_{PULSE} + V_{NOISE}^2 - V_{OS}) \cdot C1$$

$$Q_{C2}^2 = Q_{C2p}^2 + Q_{C2n}^2 \quad (4)$$
$$= (V_{OUTn}^2 - V_{OSp}) \cdot C2p + (V_{OSn} - V_{OUTp}^2) \cdot C2n$$
$$= (-V_{OUT}^2 - V_{OS}) \cdot C2$$

In a transition from Phase 1 to Phase 2, the total amount of the electric charge of the pair of capacitors $C_{1p}$ and $C_{1n}$ and the pair of capacitors $C_{2p}$ and $C_{2n}$ is preserved. Therefore, Formula (5) is satisfied.

$$Q^1_{C1} + Q^1_{C2} = Q^2_{C1} + Q^2_{C2} \quad (5)$$

$$V^2_{OUT} = -V_{REF} + (C1/C2) \cdot (V_{PULSE} + V^2_{NOISE}) \quad (6)$$

Consequently, based on Formulas (1)-(5), the output voltage $V^2_{OUT}$ in Phase 2 is represented by Formula (6).

<Phase 3 (Blank Period)>

FIG. 6 is a diagram illustrating open/close states of the switches in Phase 3. Phase 3 represents a sampling phase during which the one ends of the pair of capacitors $C_{2p}$ and $C_{2n}$ are made floating, to preserve the electric charge that has been accumulated in the pair of capacitors $C_{2p}$ and $C_{2n}$ in Phase 2. Also, Phase 3 is divided into Phase 3a, which is a period before switching is executed for the pair of switches SW1 from "close" to "open", and switching is executed for the pair of switches SW2 from "open" to "close"; and Phase 3b, which is a period after the switching was executed for the pair of switches SW1 from "close" to "open", and switching is executed for the pair of switches SW2 from "open" to "close". However, the electric charge of the pair of capacitors $C_{2p}$ and $C_{2n}$ does not change before and after switching is executed between "open" and "close" for the switches SW1 and SW2 in Phase 3.

During Phase 3a, before inverting the levels of the pair of voltages input into the pair of input nodes of the differential amplifier 41, the electric charge $Q^3_{C1}$ accumulated in the pair of capacitors $C_{1p}$ and $C_{1n}$, and the electric charge $Q^3_{C2}$ accumulated in the pair of capacitors $C_{2p}$ and $C_{2n}$ are represented by the following formulas, respectively.

$$Q^3_{C1} = (V^3_{IN} - V_{OS}) \cdot C1 \quad (7)$$

$$Q^3_{C2} = Q^2_{C2} = (-V^2_{OUT} - V_{OS}) \cdot C2 \quad (8)$$

During Phase 3b, after having inverted the levels of the pair of voltages input into the pair of input nodes of the differential amplifier 41, the electric charge $Q^{3'}_{C1}$ accumulated in the pair of capacitors $C_{1p}$ and Cm, and the electric charge $Q^{3'}_{C2}$ accumulated in the pair of capacitors $C_{2p}$ and $C_{2n}$ are represented by the following formulas, respectively.

$$Q^{3'}_{C1} = (-V^3_{IN} - V_{OS}) \cdot C1 \quad (9)$$

$$Q^{3'}_{C2} = Q^2_{C2} = (-V^2_{OUT} - V_{OS}) \cdot C2 \quad (10)$$

<Phase 4 (Second Sampling Period)>

FIG. 7 is a diagram illustrating open/close states of the switches in Phase 4. Phase 4 represents a sampling phase when the light emission pulse 12 falls.

The electric charges $Q^4$ of the capacitors $C_{1p}$, $C_{1n}$, $C_{2p}$, and $C_{2n}$ in Phase 4 are represented by the following formulas, respectively.

$$Q^4_{C1p} = \{V_{OSn} - V^{3'}_{INp} - (-V_{PULSEp}) - V^4_{NOISEp}\} \cdot C1p$$

$$Q^4_{C1n} = \{V^{3'}_{INn} + (-V_{PULSEn}) + V^4_{NOISEn} - V_{OSp}\} \cdot C1p$$

$$Q^4_{C2n} = (V_{OSn} - V^4_{OUTp}) \cdot C2n$$

$$Q^4_{C2p} = (V^4_{OUTn} - V_{OSp}) \cdot C2p$$

Therefore, in Phase 4, the electric charge $Q^4_{C1}$ accumulated in the pair of capacitors $C_{1p}$ and $C_{1n}$, and the electric charge $Q^4_{C2}$ accumulated in the pair of capacitors $C_{2p}$ and $C_{2n}$ are represented by the following formulas, respectively.

$$Q_{C1}^4 = Q_{C1p}^4 + Q_{C1n}^4 \quad (11)$$
$$= \{-V_{INp}^{3'} - (-V_{PULSEp}) - V_{NOISEp}^4 + V_{OSn}\} \cdot C1p +$$
$$\{-V_{OSp} + V_{INn}^{3'} + (-V_{PULSEn}) + V_{NOISEn}^4\} \cdot C1n$$
$$= (-V_{IN}^{3'} + V_{PULSE} - V_{NOISE}^4 - V_{OS}) \cdot C1$$

$$Q_{C2}^4 = Q_{C2p}^4 + Q_{C2n}^4 \quad (12)$$
$$= (V_{OUTn}^4 - V_{OSp}) \cdot C2p + (V_{OSn} - V_{OUTp}^4) \cdot C2n$$
$$= (-V_{OUT}^4 - V_{OS}) \cdot C2$$

In a transition from Phase 3 to Phase 4, the total amount of the electric charge of the pair of capacitors $C_{1p}$ and $C_{1n}$, and the pair of capacitors $C_{2p}$ and $C_{2n}$ is preserved.

$$Q_{C1}^3 + Q_{C2}^3 = Q_{C1}^4 + Q_{C2}^4 \quad (13)$$

$$V_{OUT}^4 = V_{OUT}^2 + (C1/C2) \cdot (V_{PULSE} - V_{NOISE}^4) \quad (14)$$
$$= -V_{REF} + (C1/C2) \cdot (2V_{PULSE} + V_{NOISE}^2 - V_{NOISE}^4)$$

Therefore, Formula (13) is satisfied. Consequently, based on Formulas (6) and (9)-(13), the output voltage $V^4_{OUT}$ in Phase 4 is represented by Formula (14).

Here, as $V_{NOISE}$, a low-frequency noise of disturbance light (for example, a low-frequency noise included in fluorescent light, LED illumination, incandescence light, and the like due to 50 or 60-Hz AC power supply) may be considered. The frequency of such a low-frequency noise of disturbance light is sufficiently lower than the sampling frequency of the correlated double sampling circuit 40. Therefore, it is possible to consider that the amount of change of $V_{NOISE}$ is virtually the same in the respective samplings at Phase 2 and at Phase 4, as represented by Formula (15).

$$V^2_{NOISE} \approx V^4_{NOISE} \quad (15)$$

$$V^4_{OUT} = -V_{REF} + 2 \cdot (C1/C2) \cdot V_{PULSE} \quad (16)$$

Therefore, based on Formulas (14) and (15), the output voltage $V^4_{OUT}$ in Phase 4 is represented by Formula (16). In other words, $V_{NOISE}$ and $V_{OS}$ are removed from the output voltage Vow during the course of Phases 1-4.

<Phase 5 (Blank Period)>

FIG. 8 is a diagram illustrating open/close states of the switches in Phase 5. Similar to Phase 3, Phase 5 represents a sampling phase during which the one ends of the pair of capacitors $C_{2p}$ and $C_{2n}$ are made floating, to preserve the electric charge that has been accumulated in the pair of capacitors $C_{2p}$ and $C_{2n}$ in Phase 4. Phase 5 is also divided into Phase 5a, which is a period before switching is executed for the pair of switches SW1 from "open" to "close", and switching is executed for the pair of switches SW2 from "close" to "open"; and Phase 5b, which is a period after the switching was executed for the pair of switches SW1 from "open" to "close", and switching is executed for the pair of switches SW2 from "close" to "open". In Phase 5, the open/close states of the switches SW1 and SW2, which have been once switched in Phase 3, are switched again, to return to the initial states. However, the electric charge of the pair of capacitors $C_{2p}$ and the $C_{2n}$ does not change before and after switching is executed between "open" and "close" for the switches SW1 and SW2 in Phase 5.

<Phases after Phase 2'>

After Phase 2', a set of phases corresponding to Phases 2-5 (one sampling cycle) is repeated for the same number of times as the number of specified light emission pulses 12. Denoting the number of specified light emission pulses 12 as n, the last or the n-th output voltage $V_{OUT}$ is represented as follows.

$$V_{OUT} = -V_{REF} + 2n \cdot (C1/C2) \cdot V_{PULSE} \quad (17)$$

As above, a proximity sensor has been described with the embodiments. Note that the present invention is not limited to the above embodiments. Various modifications and improvements can be made within the scope of the present invention, by combining and/or replacing a part of or all of the embodiments with the others.

For example, the photodetector may be any photoelectric device other than a photodiode, and may be, for example, a phototransistor.

Also, a product in which the proximity sensor is installed may be any product other than a portable information device, and may be, for example, a vehicle or a household electrical appliance.

Also, an object to be sensed is not limited to a part of a human body such as a hand or a finger, and may be an auxiliary input operation tool such as an operation stick or a touch pen.

What is claimed is:

1. A proximity sensor for detecting proximity of an object, by sensing reflected light coming from an object on which a light emission pulse is reflected, the proximity sensor comprising:
   a converter circuit configured to convert a current output from a photodetector sensing the reflected light into a voltage, and to output the voltage, magnitude of the current depending on a degree of the proximity of the object;
   a differential converter circuit configured to convert the voltage output by the converter circuit into a differential voltage, and to output the differential voltage; and
   a correlated double sampling circuit having a differential configuration, and configured to subtract a value of the differential voltage output by the differential converter circuit, sampled at falling of the light emission pulse, from a value of the differential voltage sampled at rising of the light emission pulse,
   wherein the correlated double sampling circuit includes:
   a differential amplifier;
   a first pair of capacitors;
   a second pair of capacitors inserted in series between a pair of input nodes of the differential amplifier, and a pair of output nodes of the differential amplifier;
   a first switch circuit configured to reverse a connection relationship between the first pair of capacitors and the pair of input nodes, at the rising and the falling of the light emission pulse; and
   a second switch circuit configured to turn off a connection between the pair of input nodes and the pair of output nodes at the rising and the falling of the light emission pulse, and
   wherein the proximity sensor further comprises:
   a third switch circuit configured to turn off a connection between the second pair of capacitors and the pair of output nodes, when the second switch circuit turns on the connection between the pair of input nodes and the pair of output nodes, and to turn on the connection between the second pair of capacitors and the pair of output nodes, when the second switch circuit turns off the connection between the pair of input nodes and the pair of output nodes.

2. The proximity sensor as claimed in claim 1, further comprising:
   a fourth switch circuit configured to initialize the pair of capacitors.

3. The proximity sensor as claimed in claim 1, wherein the light emission pulse is a pulse of infrared light, and the photodetector is a photodiode.

4. The proximity sensor as claimed in claim 1, further comprising:
   a driver configured to drive a light-emitting element that outputs the light emission pulse.

5. A proximity sensor for detecting proximity of an object, by sensing reflected light coming from an object on which a light emission pulse is reflected, the proximity sensor comprising:
   a converter circuit configured to convert a current output from a photodetector sensing the reflected light into a voltage, and to output the voltage, magnitude of the current depending on a degree of the proximity of the object;
   a differential converter circuit configured to convert the voltage output by the converter circuit into a differential voltage, and to output the differential voltage; and a correlated double sampling circuit having a differential configuration, and configured to subtract a value of the differential voltage output by the differential converter circuit, sampled at falling of the light emission pulse, from a value of the differential voltage sampled at rising of the light emission pulse, wherein the correlated double sampling circuit includes:

a differential amplifier;

a first pair of capacitors;

a second pair of capacitors inserted in series between a pair of input nodes of the differential amplifier, and a pair of output nodes of the differential amplifier;

a first switch circuit configured to reverse a connection relationship between the first pair of capacitors and the pair of input nodes relative to a state a half cycle prior, at the rising and the falling of the light emission pulse; and a second switch circuit configured to turn off a connection between the pair of input nodes and the pair of output nodes for a predetermined period that is shorter than one cycle at the rising and the falling of the light emission pulse.

6. The proximity sensor as claimed in claim 5, further comprising:

a third switch circuit configured to turn off a connection between the second pair of capacitors and the pair of output nodes, when the second switch circuit turns on the connection between the pair of input nodes and the pair of output nodes, and to turn on the connection between the second pair of capacitors and the pair of output nodes, when the second switch circuit turns off the connection between the pair of input nodes and the pair of output nodes.

7. The proximity sensor as claimed in claim 6, further comprising:

a fourth switch circuit configured to initialize the pair of capacitors.

8. The proximity sensor as claimed in claim 5, wherein the light emission pulse is a pulse of infrared light, and the photodetector is a photodiode.

9. The proximity sensor as claimed in claim 5, further comprising:

a driver configured to drive a light-emitting element that outputs the light emission pulse.

\* \* \* \* \*